United States Patent
Ruben et al.

(10) Patent No.: US 7,872,208 B2
(45) Date of Patent: Jan. 18, 2011

(54) LASER BONDING TOOL WITH IMPROVED BONDING ACCURACY

(75) Inventors: David A. Ruben, Mesa, AZ (US); Christopher T. Kinsey, Gilbert, AZ (US); Jeffrey L. Galvin, Mesa, AZ (US); Scott B. Sleeper, Phoenix, AZ (US)

(73) Assignee: Medtronic, Inc., Minneapolis, MN (US)

( * ) Notice: Subject to any disclaimer, the term of this patent is extended or adjusted under 35 U.S.C. 154(b) by 1128 days.

(21) Appl. No.: 11/096,433

(22) Filed: Mar. 31, 2005

(65) Prior Publication Data

US 2006/0219672 A1   Oct. 5, 2006

(51) Int. Cl.
B23K 26/00 (2006.01)

(52) U.S. Cl. .............. 219/121.63; 219/121.65; 219/121.64

(58) Field of Classification Search ........... 219/121.63, 219/121.65, 121.64, 121.66; 228/102, 4.5, 228/45

See application file for complete search history.

(56) References Cited

U.S. PATENT DOCUMENTS

| | | | |
|---|---|---|---|
| 4,142,288 A * | 3/1979 | Flammer et al. ............ 228/155 |
| 4,909,431 A * | 3/1990 | Japichino et al. ............ 228/103 |
| 4,976,392 A | 12/1990 | Smith et al. |
| 5,007,576 A | 4/1991 | Congleton et al. .......... 228/103 |
| 5,452,841 A * | 9/1995 | Sibata et al. ............. 228/180.5 |
| 5,884,830 A * | 3/1999 | Yamazaki et al. ............ 228/1.1 |
| 5,923,539 A | 7/1999 | Matsui et al. ................ 361/777 |
| 5,938,951 A | 8/1999 | Azdasht et al. |
| 6,501,043 B1 | 12/2002 | Ruben .................... 219/121.64 |
| 6,717,100 B2 | 4/2004 | Ruben .................... 219/121.64 |
| 7,407,079 B2 * | 8/2008 | Copperthite et al. ......... 228/4.5 |
| 7,413,108 B2 * | 8/2008 | Vasquez et al. .......... 228/180.5 |
| 2003/0127434 A1 | 7/2003 | Ruben |
| 2004/0256367 A1 | 12/2004 | Ruben .................... 219/121.64 |

* cited by examiner

*Primary Examiner*—M. Alexandra Elve
(74) *Attorney, Agent, or Firm*—Carol F. Barry

(57) ABSTRACT

A bonding tool for use in a laser bonding apparatus comprises an elongated body portion and a foot portion coupled thereto. The foot portion extends substantially transversely from the body portion and has a laser aperture and a guide channel therethrough. The guide channel is disposed between the body portion and the laser aperture.

20 Claims, 6 Drawing Sheets

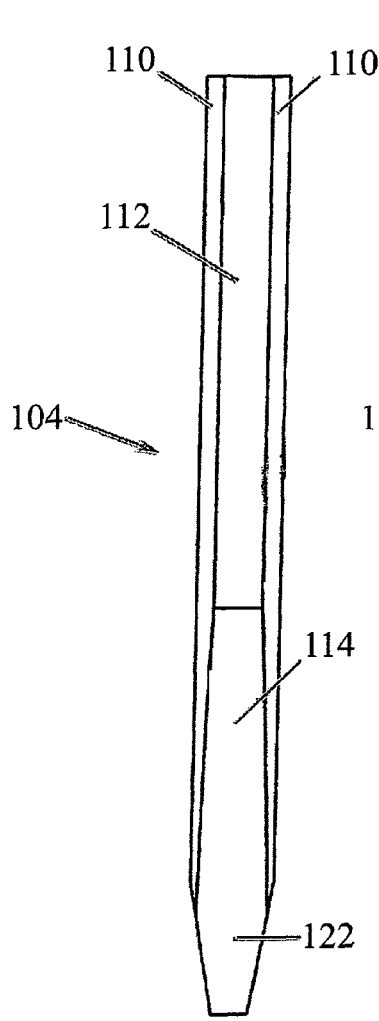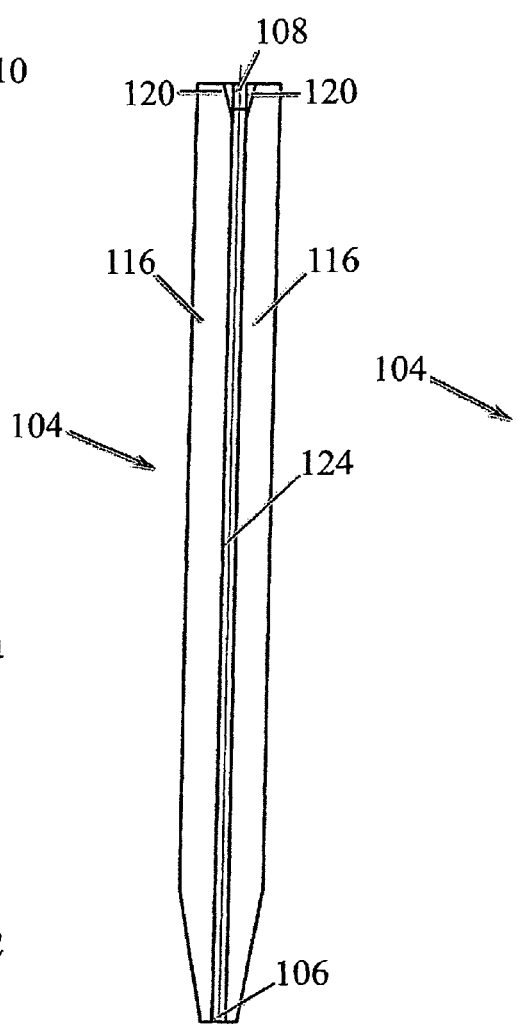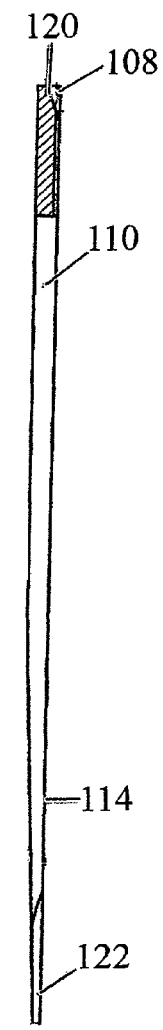
FIG. 13  FIG. 14  FIG. 15
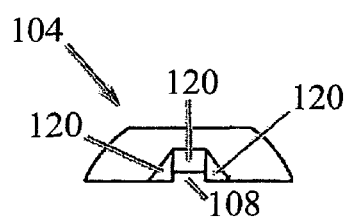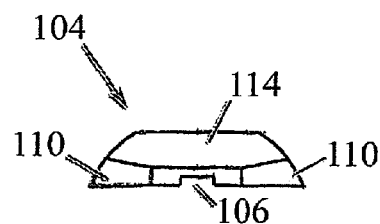
FIG. 16  FIG. 17

LASER BONDING TOOL WITH IMPROVED BONDING ACCURACY

FIELD OF THE INVENTION

This invention relates generally to laser bonding, and more particularly to an improved bonding tool used in a laser bonding apparatus.

BACKGROUND OF THE INVENTION

Integrated circuits have become increasingly smaller, and consequently the process for electrically coupling such integrated circuits to other components (e.g., other integrated circuits) demands increasing precision. It is well known, for example, to produce electronic connections by means of soldering; i.e., melting alloy or chemical element with a relatively low melting temperature wherein the base materials of the workpieces being joined are not melted and do not become part of a joint. Alternatively, it is known to make electronic connections between components by means of welding. This involves the melting of the base workpieces to be joined resulting in the formation of a weld nugget comprised of material from both of the components being joined; i.e., by means of a fusion or mixing of the base metals. In such applications, heat is often employed to support the soldering or welding process; however, traditional heating methods have certain drawbacks when used in the microelectronic integrated circuit environment. That is, the application of heat to the bonding site typically involves either a bonding tool to convey heat to the bonding site or a heater block, which may be clamped to a circuit lead frame. Such processes, however, may result in distortion or bending of the lead frame or damage to the electronic components being joined especially if the heat source is large compared to the area being bonded.

Ribbon and wire bonders that utilize ultrasonic energy to bond conductive wires or ribbons to substrates, lead frames, or other components are also known. In this case, a bonding tool imparts high frequency vibrations to the parts being bonded resulting in metallurgical atomic diffusion bonding. Unfortunately, ultrasonic bonding suffers certain drawbacks. For example, ultrasonic or thermal-sonic (ultrasonic vibration in combination with the application of heat) bonding methods may find application in bonding flat, rigid structures, but are not well-suited to bond less rigid (flexible or semi-flexible) structures since such structures tend to vibrate in response to the ultrasonic energy resulting in loss of energy and therefore an inefficient process. Furthermore, the ultrasonic energy or vibration may cause unwanted movement of the parts being joined during the bonding process resulting in weaker and/or inconsistent bonds. In addition, ultrasonic bonding is typically only employed with certain metals such as gold, aluminum, and copper.

As a result of the limitations described above, known bonding techniques have given way to improved systems that utilize a laser to produce electrical interconnections by means of a connecting medium such as conductive ribbons or wires. One known laser bonding apparatus and method is described in U.S. Pat. No. 6,717,100 B2 entitled "Apparatus and Method for Laser Welding of Ribbons" issued Apr. 6, 2004 and assigned to the assignee of the present invention. This laser bonding apparatus positions a bonding tool over a first bonding site. A connecting medium, such as a conductive metal ribbon, is supplied from a standard spool, and the bonding tool is adapted to receive the ribbon through a guide slot that includes a ribbon entrance and a ribbon exit. The bonding tool is somewhat boot-shaped having a generally vertical leg or body portion and a forwardly extending foot portion having a laser aperture therethrough. In this known laser bonding apparatus, the bonding ribbon is guided through an opening in the leg or body portion and exits the leg portion at a point proximate the rear of the foot portion (i.e., the heel) where it is then threaded through a guide slot and beneath the bonding surface of the bond foot.

To produce a bond at a specific location, the bonding tool is maneuvered to that location such that the conductive ribbon is positioned between a lower or bonding surface of the foot portion and the substrate or component to which the ribbon is to be attached. The conductive ribbon is then exposed to a laser beam through the laser aperture in the foot portion to effectuate the required connection. After the ribbon is bonded to this first site, the laser ribbon bonding apparatus may move the bonding tool to a second bonding site to perform a second bonding operation thus electrically connecting the first bonding site to the second bonding site. As the bonding tool is moved to the second site, the ribbon, now secured to the first site, is pulled through the tool to form a connecting loop or strap. The laser bonding apparatus may repeat these steps to electrically connect addition sites, or the laser bonding apparatus may simply terminate the operation as, for example, by clamping the ribbon and performing a series of motions to break the ribbon proximate the last bonding site in the bonding sequence.

It should be appreciated that the quality and/or accuracy of a bond produced by a laser bonding apparatus of the type above described is significantly influenced by the degree to which the ribbon is properly aligned beneath the laser aperture. Because the ribbon enters the entrance of a guide slot at the rear of the bonding tool and exits the guide slot in the heel portion of the bonding tool it must then travel a significant distance to the laser aperture possibly resulting in misalignment of the ribbon beneath the laser aperture. This, in turn, may result in an improper or ineffective bond. In addition, the excessive length of travel can result in excessive ribbon slack. Last but not least, certain difficulties have been encountered when attempting to thread the ribbon into the ribbon entrance of the guide slot.

It should thus be appreciated that it would be desirable to provide a laser bonding apparatus configured to provide a more reliable presentation of the bonding ribbon beneath the laser aperture of a bonding tool. It would further be desirable to provide an improved bonding tool for use in a laser ribbon bonding system that is configured to reduce the distance that the ribbon must travel from the output of a guide channel proximate a bonding surface to a bonding position beneath a laser aperture. It would be still further desirable to provide a bonding tool for use in a laser ribbon bonding apparatus that is configured to facilitate threading the ribbon through a guide channel proximate a laser aperture for presentation beneath the laser aperture. Other desirable features and characteristics of the present invention will become apparent from the subsequent detailed description of the invention and the appended claims, taken in conjunction with the accompanying drawings and this background of the invention.

BRIEF SUMMARY OF THE INVENTION

According to a broad aspect of the invention there is provided a bonding tool for use in a laser bonding apparatus that comprises an elongated body portion and a foot portion coupled thereto. The foot portion extends substantially transversely from the body portion and has both a laser aperture and a guide channel therethrough. The guide channel is disposed between the body portion and the laser aperture.

BRIEF DESCRIPTION OF THE DRAWINGS

The present invention will hereinafter be described in conjunction with the following figures, wherein like reference numerals denote like elements, and:

FIGS. 13 and 14 are front and back views, respectively, of the cover shown in FIGS. 11 and 12;

FIG. 15 is a side, partial cross-sectional view of the cover shown in FIGS. 11-14; and FIGS. 16 and 17 are top and bottom views, respectively, of the cover shown in FIGS. 11-15.

DETAILED DESCRIPTION OF THE INVENTION

The following detailed description of the invention is merely exemplary in nature and is not intended to limit the scope, applicability, or configuration of the invention in any way. Rather, the following description provides a convenient illustration for implementing exemplary embodiments of the invention. Various changes to the described embodiments may be made in the function and arrangement of the elements described herein without departing from the scope of the invention.

Figure 1:
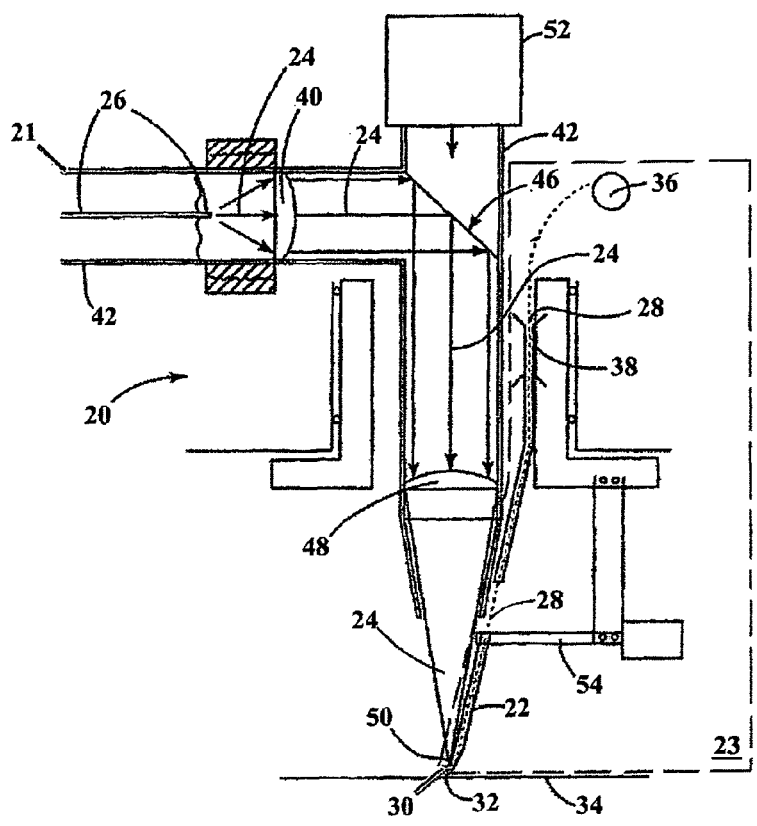
FIG. 1 is a cross-sectional view of a ribbon bonding apparatus including a bonding tool in accordance with the present invention.

FIG. 1 is a cross-sectional view of a portion of a laser bonding apparatus 20, which utilizes a laser beam 24 to bond sections of a conductive bonding ribbon 28 to different bonding sites and thereby couple various electronic workpieces or device terminals. Laser bonding apparatus 20 comprises two general assemblies: a laser assembly 21 and a ribbon positioning assembly 23. Assemblies 21 and 23 may be moved together in the x, y, and z directions with the tool free to rotate about the laser axis as necessary to position laser focal point 50 and ribbon 28, respectively, relative to a particular bonding site (e.g., bonding site 32 on workpiece 34). Laser assembly 21 comprises a housing 42 having an optic fiber 26 (e.g., a glass optic fiber) therein. Optic fiber 26 emits laser beam 24, which may be manipulated by various optics (e.g., mirrors, lenses, etc.) provided within housing 42. For example, as shown in FIG. 1, laser beam 24 may pass through a collimating lens 40 and thus be transformed (i.e., spread out) into a broad beam before being directed 90 degrees downward by a mirror 46 (e.g., a dichroic mirror). The broad laser beam may then pass through a focusing lens 48 and exit housing 42. Focusing lens 48 serves to focus laser beam 24 at focal point 50, which is located at some distance beyond housing 42 and lens 48. Focal point 50 may be positioned proximate the section of conductive ribbon 28 to be bonded to heat this section of ribbon 28 and bond it to, for example, a bonding site 32 located on workpiece 34. The position of focal point 50 may be adjusted relative to ribbon 28 and the bonding site to control the degree to which laser beam 24 heats ribbon 28.

The section of connective ribbon 28 to be bonded is positioned proximate a bonding site (e.g., bonding site 32) by ribbon positioning assembly 23. Ribbon positioning assembly 23 comprises a spool 36 that supplies ribbon 28 and a bonding tool 22 that is fixedly coupled to a bonding tool arm 54. As can be seen in FIG. 1, ribbon 28 passes through a ribbon clamp 38 before being received by bonding tool 22. The way in which bonding tool 22 receives and positions ribbon 28 will be described in more detail herein below. Simply stated, bonding tool 22 is provided with a series of channels or slots through which ribbon 28 passes before emerging at the underside (i.e., the bonding surface) of a lower and forwardly extending section 30 of bonding tool 22 (i.e., the foot portion). Ribbon 28 passes beneath a laser aperture in the foot portion of bonding tool 30, through which laser beam 24 may reach and heat the exposed section of ribbon 28 to be bonded.

To produce a bond at a specific location (e.g., bonding site 32), the section of ribbon 28 to be bonded is positioned by maneuvering ribbon positioning assembly 23 to a desired bonding site. To facilitate ribbon positioning (or to simply view the bonding process), a visual sighting means (e.g., a camera 52) may be provided within laser focusing assembly 21 (e.g., mounted on housing 42 above mirror 46). After ribbon 28 properly aligned with the bonding site, laser beam 24 is fired and bonding is accomplished. Subsequently, laser ribbon bonding apparatus 20 moves to a second bonding site to perform a second bonding operation and thus electrically connect the two bonding sites. After the sites have been connected, laser bonding apparatus 20 may repeat these steps to further connect addition sites. Alternatively, apparatus 20 may simply terminate the operation by securing ribbon 28 via ribbon clamp 38 and performing a series of motions to break ribbon 28 proximate the second bonding site.

Figure 2:
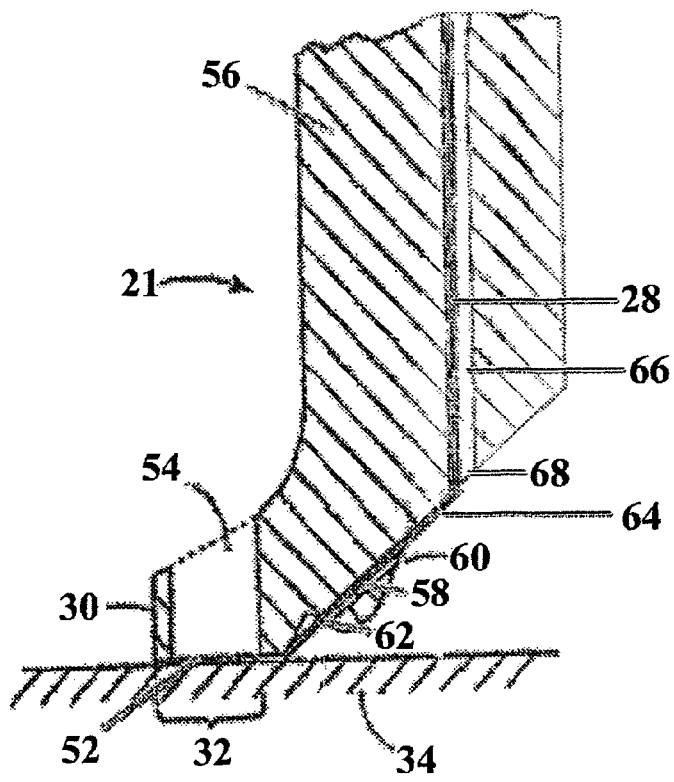
FIG. 2 is a cross-sectional view of a bonding tool in accordance with the prior art.

FIG. 2 is a cross-sectional view of a known bonding tool 21 that comprises two general portions: an elongated body portion 56 (only the bottom portion of which is shown in FIG. 2) and a foot portion 30 that extends transversely from body portion 56 (e.g., in a forward direction). A laser aperture 54, preferably conical in shape, extends through a central portion of foot portion 30 and permits laser beam 24 (FIG. 1) to impact an exposed section 52 of ribbon 28 and thereby bond ribbon 28 to a particular bonding site (e.g., site 32 of workpiece 34).

Ribbon 28 travels through bonding tool 21 to laser aperture 54 in the following manner. First, ribbon 28 enters a ribbon conduit 66 proximate the top of body portion 56 and is guided down the length of body portion 56 to exit 68. Ribbon conduit 66 may have a substantially rectangular cross-section and is configured to receive conductive bonding ribbons of various thicknesses (e.g., 1 millimeter). Ribbon 28 exits conduit 66 at exit 68 and travels substantially unguided for some distance 64. Thereafter, ribbon 28 is received at an inlet 60 of guide slot 58, which is provided through body portion 56 proximate the heel of foot portion 30. After exiting slot 58 at an outlet 62, ribbon 28 travels unguided before passing beneath a lower, working surface of foot portion 30. When a section (e.g., the terminal end) of ribbon 28 is positioned beneath foot portion 30 and exposed through laser aperture 54 and bonding tool 21 may descend to the surface of a bonding site (e.g., site 32 on workpiece 34) and bonding may commence.

As mentioned previously, the quality and accuracy of a bond is significantly influenced by the degree to which the bonding ribbon is aligned beneath the laser aperture. Bonding tool 21, however, requires that the bonding ribbon travel, at times unguided, a significant distance from the bottom rear region of the elongated body portion to the laser aperture. This permits an undesirable degree of ribbon freedom that may result in the misalignment of the ribbon beneath the laser aperture. Ribbon misalignment, in turn, may result in the formation of an improper and/or ineffective bond.

Figure 3:
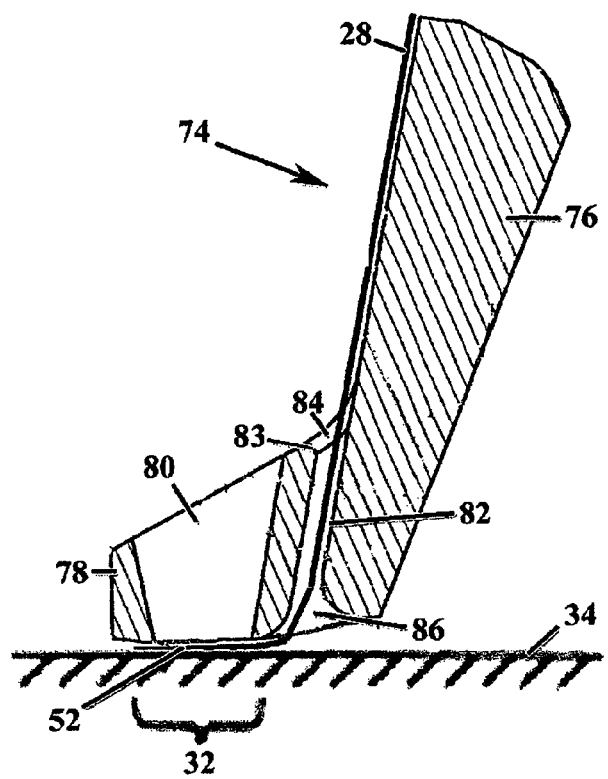
FIGS. 3 and 4 are cross-sectional and isometric views, respectively, of a first embodiment of the inventive bonding tool.
Figure 4:
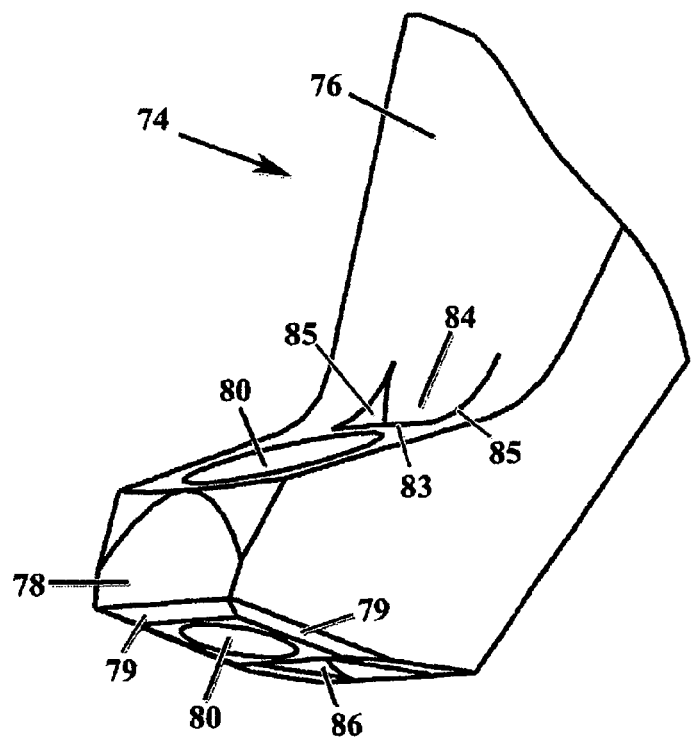

FIGS. 3 and 4 are cross-sectional and isometric views, respectively, of a bonding tool 74 in accordance with a first embodiment of the present invention. Similar to known bonding tool 21, bonding tool 74 comprises two general portions: an elongated body portion 76 (only the bottom portion of which is shown in FIGS. 3 and 4) and a foot portion 78, which extends transversely from body portion 76 (e.g., in a forward direction). Foot portion 78 has provided therethrough a laser aperture 80 that permits section 52 of bonding ribbon 28 to be exposed to laser beam 24 (FIG. 1) and thereby bonded to a bonding site (e.g., bonding site 32 on workpiece 34 as shown in FIG. 3). To help guide ribbon 28 through foot portion 78 and beneath its working surface, bonding tool 74 further comprises a guide channel 82 therethrough having an inlet 84 and an outlet 86. Guide channel 82 is disposed between laser aperture 80 and elongated body portion 76 such that inlet 84 is provided through the upper surface of foot portion 78 proximate a distal region of body portion 76, Outlet 86 is provided at a lower working surface of foot portion 78 substantially adjacent the bottom of laser aperture 80. Channel 82 is thus adapted to receive bonding ribbon 28 at inlet 84, guide ribbon 28 through foot portion 78, and present ribbon 28 at outlet 86 for subsequent positioning beneath laser aperture 80. It should thus be appreciated that bonding tool 74 provides a more direct presentation of bonding ribbon 28 beneath foot portion 78 and, as a result, a more reliable and accurate alignment of ribbon 28 beneath laser aperture 80.

Figure 5:
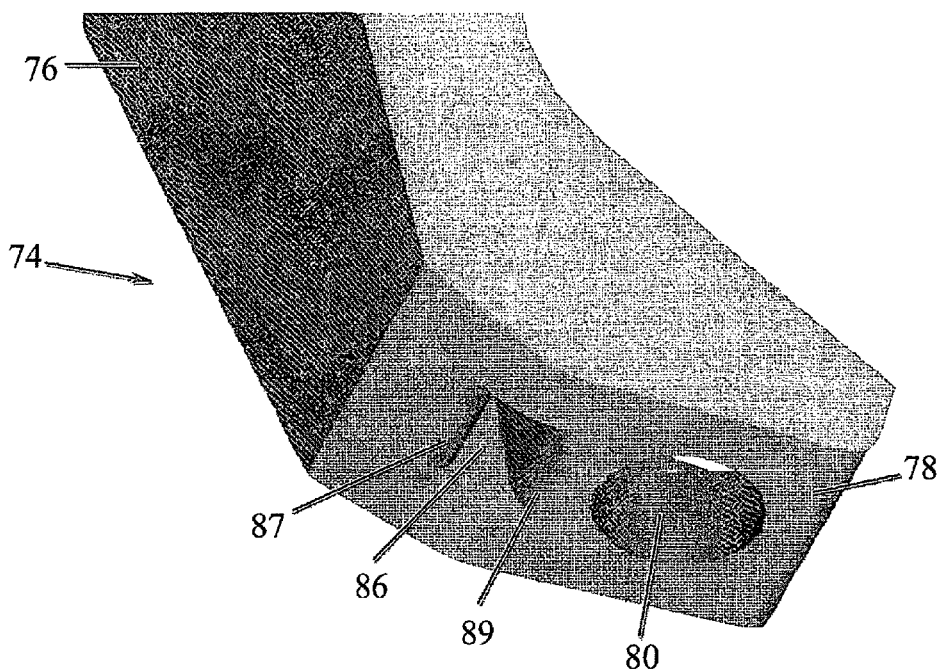
FIGS. 5 and 6 are bottom isometric and bottom views, respectively, of the bonding tool shown in FIGS. 3 and 4.
Figure 6:
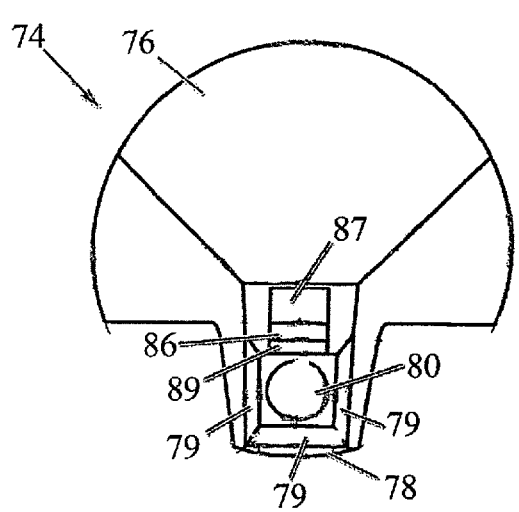
Figure 7:
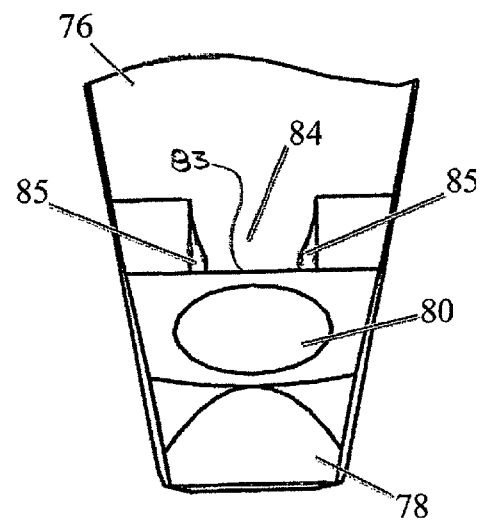
FIG. 7 is a top view of the foot of the bonding tool shown in FIGS. 3-6.

It may be desirable to contour inlet 84 and outlet 86 of ribbon channel 82 to better accommodate ribbon 28. For example, a front edge 83 of inlet 84 may be curved or bull-nosed as shown in FIGS. 3 and 7 to protect ribbon 28 and facilitate ribbon threading. Additionally, outlet 86 of ribbon channel 82 may also be contoured as shown in FIGS. 5 and 6, which are bottom isometric and bottom views of bonding tool 74, respectively. That is a front edge 89 of outlet 86 may be curved or bull-nosed to provide a smoother transition of ribbon 28 from outlet 86 of guide channel 82 toward laser aperture 80. Rear edge 87 of outlet 86 may be similarly curved or bull-nosed for added ribbon protection. Lastly, the edges of working surface of foot portion 78 may be chamfered as is shown in 79 in FIGS. 4 and 6 to provide bonding tool 22 with a greater range of motion when engaging and disengaging workpieces.

Figure 8:
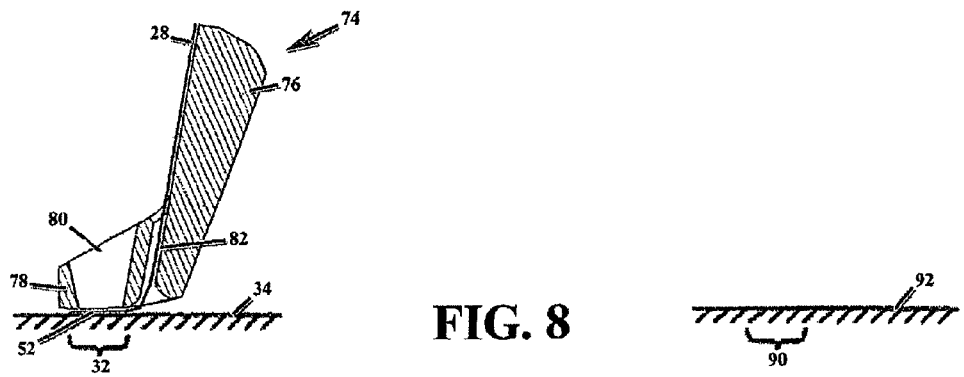
FIGS. 8-10 illustrate a method of laser ribbon bonding utilizing the bonding tool shown in FIGS. 3-7.
Figure 9:
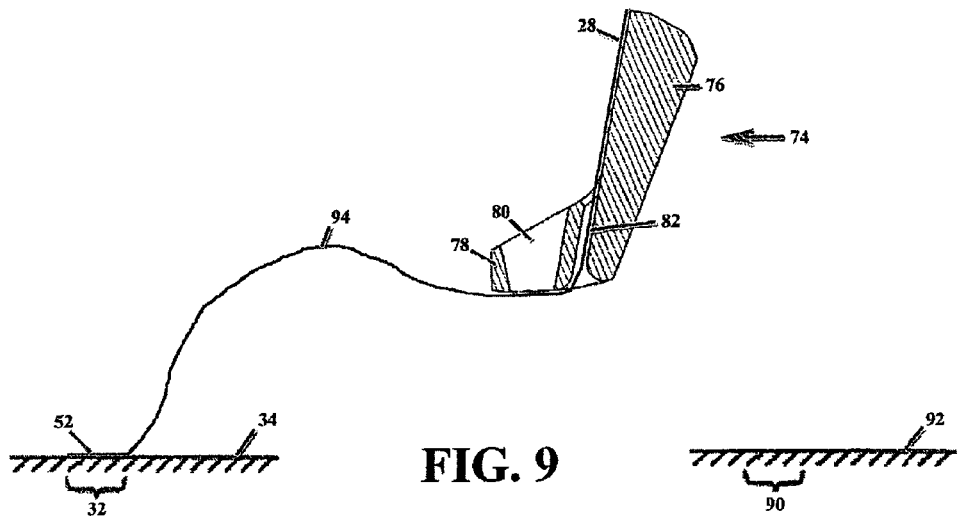
Figure 10:
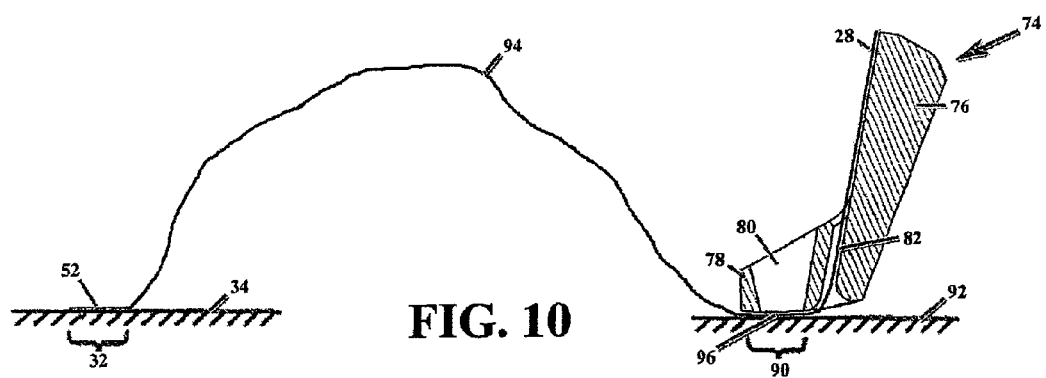

FIGS. 8-10 illustrate a method of laser ribbon bonding utilizing bonding tool 74 wherein a first workpiece 34 is joined to a second workpiece 92. As shown in FIG. 8, bonding tool 74 is first positioned over bonding site 32 located on workpiece 34, and laser beam 24 (FIG. 1) is fired to bond exposed section 52 of ribbon 28 to site 32. Next, as shown in FIG. 9, bonding tool 74 is moved from first bonding site 32 toward a second bonding site 90 located on second workpiece 92. As the terminal end of ribbon 28 (i.e., section 52 of ribbon 28) is now fixedly bonded to bonding site 32, spool 36 FIG. 1) supplies more ribbon 28 as bonding tool 74 moves away from workpiece 34. This results in the formation of a bonding loop 94 between workpieces 34 and 92. After bonding tool 74 reaches second bonding site 90, laser beam 24 (FIG. 1) is again fired, and a second section 96 of ribbon 28 is bonded to site 90. Workpieces 34 and 92 have thus been electronically and mechanically coupled as shown in FIG. 10. If it is desired to couple a third workpiece to the joined workpieces, the steps illustrated in FIGS. 8-10 may be repeated. Alternatively, if it is desired that only workpieces 34 and 92 be coupled together, laser bonding apparatus 20 (FIG. 1) may simply terminate ribbon 28 proximate bonding site 90 by, for example, securing ribbon 28 via clamp 38 (FIG. 1) and undergoing a series of motions to fatigue and break the ribbon.

Figure 11:
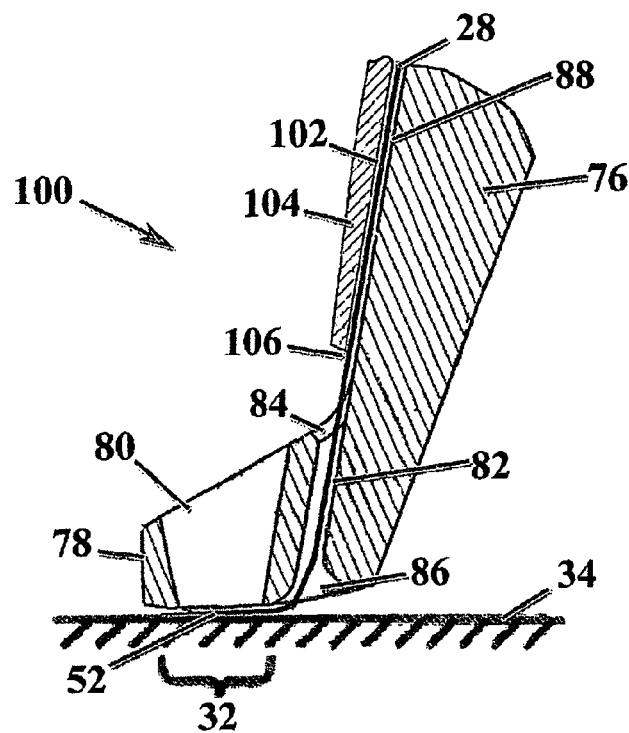
FIGS. 11 and 12 are cross sectional side and isometric cross-sectional views, respectively, of a second embodiment of the inventive bonding tool utilizing a cover.
Figure 12:
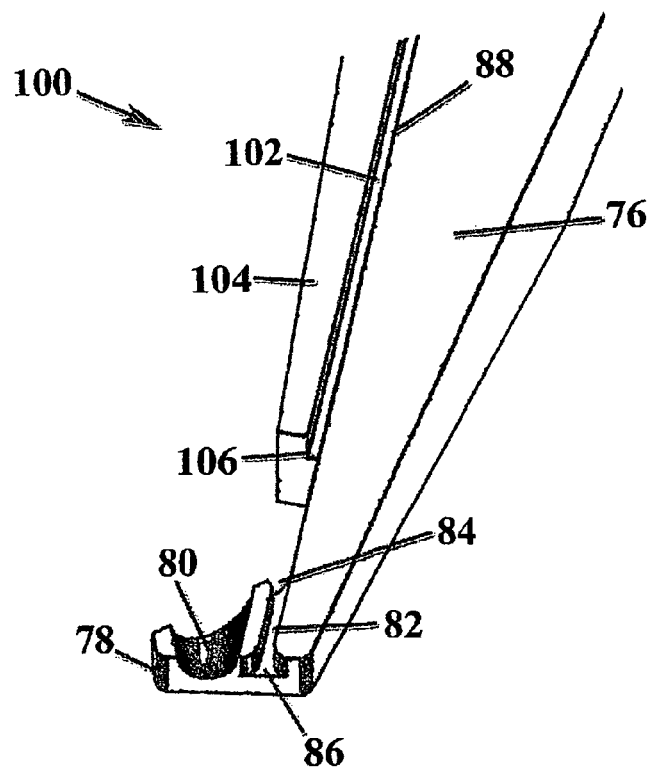

FIGS. 11 and 12 are cross-sectional side and cross-sectional isometric views, respectively, of a bonding tool 100 in accordance with a second embodiment of the present invention. As may be most readily appreciated by comparing FIG. 10 and FIG. 3, bonding tool 100 differs from bonding tool 74 in that a cover 104 is provided along a front surface 88 of body portion 76. Cover 104 may be formed integrally with elongated body portion 76 by way of, for example, welding, application of an adhesive, or attachment via one or more fasteners (e.g., set screws). Cover 104 cooperates with front surface 88 to form a ribbon conduit or guide 102 through which ribbon 28 may pass. The entrance of ribbon guide 102 may be located near the top of cover 104 and, when cover 104 is coupled to body portion 76, the proximal end of body portion 76 (not shown in FIGS. 11 and 12). The exit of ribbon guide 102 is preferably provided near the distal end of body portion 76 just above foot portion 78 (i.e., proximate inlet 84 of guide channel 82). Thus, in its preferred embodiment, ribbon guide 102 may guide ribbon 28 from the proximal end of bonding tool 74 along the length of body portion 76 to inlet 84 of guide channel 82, which then guides ribbon 28 through foot portion 78 proximate laser aperture 80 in the manner described above.

The form of cover 104 may vary to suit a particular application; however, one embodiment of cover 104 is shown in FIGS. 13, 14, 16, 17, which are front, back, top, and bottom views, respectively, of cover 104. FIG. 15 is a side view of cover 104 and depicts the upper portion of cover 104 in cross-section to better illustrate the location of an entrance 108 of cover 104. Referring first to FIG. 13, it can be seen that cover 104 comprises an upper front surface 112, a lower front surface 114, and two sides 110. Lower front surface 114 is inclined inward such that lower tip 122 of cover 104 is tapered (see FIGS. 13-15 and 17). A longitudinal groove 124 shown in FIG. 14 is provided along back surface 116 of cover 104 and has a substantially rectangular cross-section. Back surface 116 is substantially flat and may be coupled to front surface 88 of elongated body 76 to form ribbon guide 102 (FIGS. 11 and 12) in the manner described above. Groove 124 comprises an entrance 108 and exit 106. Entrance 108 is provided in the top of cover 104 as shown in FIGS. 14-16. If desired, edges 120 of entrance 108 may be contoured (e.g., chamfered) to facilitate ribbon threading. Cover 104 is configured to be coupled to surface 88 of elongated body portion 76 such that entrance 108 is proximate the proximal end of portion 76 and exit 106 is proximate inlet 84 of guide channel 82. It should thus be appreciated that cover 104 functions to further direct bonding ribbon 28 (FIG. 11) and may therefore further improve the reliability and accuracy of ribbon alignment beneath laser aperture 80 (FIGS. 11 and 12).

It should be appreciated from the above that there has been provided an improved bonding tool configured to provide a more direct and reliable presentation of bonding ribbon at the working surface of the foot portion proximate the laser aperture that reduces the distance that the ribbon must travel unguided before reaching the bonding position beneath a laser aperture. Although the inventive bonding tool has been discussed in conjunction with bonding ribbon only, it should be understood that the bonding tool may be adapted to receive and direct other forms of elongated bonding media including bonding wire.

While a limited number of exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. Various changes can be made in the function and arrangement of elements without departing from the scope of the invention as set forth in the appended claims and the legal equivalents thereof.

What is claimed is:

1. A bonding tool for use in a laser bonding apparatus, the bonding tool comprising:
    an elongated body portion having a front surface; and
    a foot portion coupled to said elongated body portion and extending in a forward direction from the front surface of the body portion, the foot portion having a working surface including a laser aperture positioned at a location adjacent to the front surface of the body portion to define a bonding position, and a guide channel extending through the foot portion between the front surface of said elongated body portion and the laser aperture.

2. A bonding tool according to claim 1 wherein said foot portion includes an upper surface and a lower surface and wherein said guide channel extends from the upper surface to the lower surface, the working surface being formed along the lower surface.

3. A bonding tool according to claim 2 wherein said guide channel includes an inlet at the upper surface and an outlet at the working surface, the outlet being adjacent the laser aperture.

4. A bonding tool according to claim 3 wherein a forward edge of the outlet of said guide channel is curved.

5. A bonding tool according to claim 4 wherein a rearward edge of the outlet includes a curved portion.

6. A bonding tool according to claim 3 further comprising a cover coupled to the front surface of said body portion.

7. A bonding tool according to claim 6 wherein said cover includes a channel formed in a surface thereof such that when said cover is coupled to said body portion, a ribbon guide is formed between said cover and said body portion.

8. A bonding tool according to claim 7 wherein said ribbon guide includes a substantially rectangular cross-section.

9. A bonding tool according to claim 7 wherein said ribbon guide includes an inlet proximate an upper portion of said body portion and an outlet proximate the inlet of said guide channel.

10. A bonding tool according to claim 3 wherein the lower surface of said foot includes chamfered edges.

11. A bonding tool for use in a laser bonding apparatus, the bonding tool comprising:
    an elongated body portion having a front surface;
    a cover having a longitudinal channel in a surface thereof, said cover coupled to the front surface of said elongated body portion and forming therewith a longitudinal ribbon guide channel having an inlet and an outlet; and
    a foot portion coupled to said elongated body portion and extending transversely from the front surface of the elongated body portion in a forward direction, a laser aperture in the foot portion defining a bonding position within a working surface of the foot portion, and a guide channel extending through the foot portion, the guide channel having an inlet proximate the outlet of said ribbon guide and having an outlet proximate said laser aperture, wherein the guide channel extends through the foot portion between the front surface of said elongated body portion and the laser aperture.

12. A bonding tool according to claim 11 wherein said foot portion includes an upper surface and a lower surface and wherein said guide channel extends from the upper surface to the lower surface.

13. A bonding tool according to claim 12 wherein a forward edge of the outlet of said guide channel is curved.

14. A bonding tool according to claim 13 wherein the outlet includes a curved rearward edge.

15. A bonding tool according to claim 14 wherein the lower surface of said foot includes chamfered edges.

16. An apparatus for bonding a section of bonding ribbon to at least one workpiece, comprising:
    a laser assembly for generating and directing a laser beam; and
    a ribbon positioning assembly moveable with respect to said laser assembly, comprising:
        a housing:
        a ribbon supply spool coupled to said housing for supplying bonding ribbon; and
        a bonding tool coupled to said housing, the bonding tool including (i) a body portion having a front surface and (ii) a foot portion extending in a forward direction from the front surface of the body portion, the foot portion having a working surface including a laser aperture positioned at a location adjacent to the front surface of the body portion, and (iii) a guide channel extending through the foot portion between the front surface of the elongated body portion and the laser aperture, the guide channel having an inlet and an outlet, the guide channel being adapted to present bonding ribbon supplied by said ribbon supply spool to the working surface.

17. The apparatus of claim 16, further comprising a cover coupled to the front surface of the body portion, the cover and the front surface forming a ribbon guide disposed above the guide channel.

18. The apparatus of claim 16, wherein the outlet of the guide channel includes a curved forward edge.

19. The apparatus of claim 18, wherein the outlet of the guide channel includes a curved rearward edge.

20. The apparatus of claim 16, wherein the foot portion has a heel portion and a toe portion, the laser aperture being in the toe portion and the guide channel being disposed between the heel portion and the toe portion.

* * * * *